US006545371B1

(12) United States Patent
Matsumoto et al.

(10) Patent No.: US 6,545,371 B1
(45) Date of Patent: Apr. 8, 2003

(54) SEMICONDUCTOR DEVICE WHEREIN DETECTION OF REMOVAL OF WIRING TRIGGERS IMPAIRING OF NORMAL OPERATION OF INTERNAL CIRCUIT

(75) Inventors: Hironori Matsumoto, Nara (JP); Akihiko Nakano, Nara (JP); Toshinori Ohmi, Nara (JP); Eiji Yanagawa, Tenri (JP); Hideyuki Unno, Ebina (JP); Hiroshi Ban, Machida (JP); Tadao Takeda, Ebina (JP)

(73) Assignees: Sharp Kabushiki Kaisha, Osaka (JP); Nippon Telegraph and Telephone Corporation, Tokyo (JP)

( * ) Notice: Subject to any disclaimer, the term of this patent is extended or adjusted under 35 U.S.C. 154(b) by 31 days.

(21) Appl. No.: 09/834,605

(22) Filed: Apr. 16, 2001

(30) Foreign Application Priority Data

Jun. 2, 2000 (JP) ........................ 2000-166689

(51) Int. Cl.[7] .............................................. H01L 23/58
(52) U.S. Cl. ...................... 257/922; 257/638; 257/659; 257/660
(58) Field of Search .................... 257/660, 659, 257/638, 922

(56) References Cited

U.S. PATENT DOCUMENTS 5,061,978 A * 10/1991 Mizutani et al. ............ 257/290
5,717,224 A * 2/1998 Zhang ........................ 257/435
6,031,593 A * 2/2000 Morikawa et al. .......... 349/110
6,380,561 B1 * 4/2002 Ohtani et al. ................. 257/71

FOREIGN PATENT DOCUMENTS

| JP | A1 16512 9 | 6/1989 |
| JP | A10 27056 2 | 10/1998 |
| JP | A11 15467 4 | 6/1999 |

* cited by examiner

Primary Examiner—Albert W. Paladini
Assistant Examiner—Luan Thai
(74) Attorney, Agent, or Firm—Birch, Stewart, Kolasch & Birch

(57) ABSTRACT

A semiconductor device includes, on a protective film laminated on a circuit principal part, (i) a light blocking film provided so as to cover the circuit principal part, (ii) an aluminum oxide film provided so as to completely cover the light blocking film, and (iii) a light-blocking upper wiring provided on the aluminum oxide film. An attempt to exfoliate the light blocking film or the light blocking upper wiring causes the resistance-detection-use upper wiring to break or thin, thereby resulting in an increase in the resistance of the resistance-detection-use wiring. The increase in the resistance is detected by the resistance detecting circuit part, and malfunction or inoperativeness of the circuit principal part is caused in response of detection. By so doing, the circuit principal part can be protected from analysis.

20 Claims, 15 Drawing Sheets

SEMICONDUCTOR DEVICE WHEREIN DETECTION OF REMOVAL OF WIRING TRIGGERS IMPAIRING OF NORMAL OPERATION OF INTERNAL CIRCUIT

FIELD OF THE INVENTION

The present invention relates to a semiconductor device capable of protecting its circuit arrangement from analysis, thereby making it difficult to imitate or duplicate the circuit or to alter information.

BACKGROUND OF THE INVENTION

A semiconductor device is generally composed of a multiplicity of semiconductor elements provided on a substrate, and wirings provided between electrodes of the semiconductor elements. In such a semiconductor device, to protect the foregoing structure from effects of the external atmosphere, such as α rays, moisture, or stress, a circuit section is protected with a protective film with insularity made of silicon oxide, silicon nitride, or the like. This enables prevention of malfunctions caused by moisture intrusion, etc., changes of characteristics caused by stress, and the like.

Besides, some circuit sections of semiconductor devices are developed as a result of long-time studies, or some are very unique, which are preferably protected so as not to be imitated or copied by others. Moreover, some circuits of semiconductor devices are memory elements in which important information is stored, which are preferably protected so that information therein should not be altered.

The protective films described above are intended to merely protect the circuit section from the external atmosphere, and as to the optical aspect, many of them exhibit good permeability with respect to visible light and far infrared radiation, allowing the circuit section to be easily observed through the protective film by means of visible radiation microscopes or infrared radiation microscopes. This could permit the circuit section to be imitated or copied, and information in memory elements to be altered. Therefore, conventionally, structures as described below have conventionally been adapted to prevent this.

(1) In a structure disclosed in the Japanese Publication for Laid-Open Patent Application No. 165129/1989 (Tokukaihei 1-165129 [Date of Publication: Jun. 29, 1989]), as shown in FIG. 14, an integrated circuit includes a circuit section 40 in which a multiplicity of semiconductor elements provided on a semiconductor substrate are mutually connected via wirings, and a protective film 42 with insularity that covers the circuit section 40. The protective film 42 is made from, for instance, silicon nitride, in which a metallic film 43 with conductivity is provided. Parts of a surface of the circuit section 40 where security protection is not required is covered with only the protective film 42, while regions of main sections are covered with a lower layer 42a of the protective film 42, a metallic film 43, and an upper layer 42b of the protective film 42 in the stated order.

This ensures that in etching the protective film 42, an entirety of the protective film 42 is removed from regions where security protection is not required, while only the upper layer 42b of the protective film 42 on the metallic film 43 is removed in the regions of the main sections covered with the metallic film 43. Thus, since the metallic film 43 is not removed, the main sections that require security protection are not exposed, thereby being invisible. Besides, even if the metallic film 43 is removed by etching in the foregoing state, wiring patterns 41 that are made from the same material as that of the metallic film 43, for instance, aluminum, are also removed, resulting in that the circuit section 40 cannot be analyzed. Thus, by covering the main sections of the circuit section 40 with the metallic film 43 having conductivity while inserting the insulating protective film 42 therebetween, the integrated circuit is protected from being imitated or duplicated by others.

(2) The Japanese Publication for Laid-Open Patent Application No. 154674/1999 (Tokukaihei 11-154674 [Date of Publication: Jun. 8, 1999]) discloses a structure as shown in FIG. 15. More concretely, on one main surface of a semiconductor substrate 50 wherein an integrated circuit is formed, an insulator isolating layer 51 comprising silicon dioxide ($SiO_2$) is deposited. In the insulator isolating layer 51, first and second wirings 52 and 53 that are made of aluminum (Al) and connected to the integrated circuit, and a shielding layer 54 made of Al are embedded and formed. Opening parts 54a and 54b are formed in the shielding layer 54, and connecting layers 55 and 56 made of Al are formed in the same layer as the shielding layers 54 in the opening parts 54a and 54b. Both ends of the connecting layer 55 are connected to cut-end parts 52a of the first wiring 52 through vias 57 made of tungsten (W). Both ends of the connecting layer 56 are connected to cut-end parts 53a of the second wiring 53 through vias 58 made of W. A surface-protecting layer 51b is formed on the surface of the shielding layer 54.

In this arrangement wherein the integrated circuit is shielded by the shielding layer 54 and the shielding layer 54 and the connecting layers 55 and 56 are made of the same material and formed in the same layer, an attempt to remove the shielding layer 54 by etching results in removal of the connecting layers 55 and 56 at the same time. Thus, by providing the shielding layer 54 that optically shields the foregoing wirings and by forming the connecting layers 55 and 56 as part of the foregoing wirings in the same layer in that the shielding layer 54 exists, it is possible to prevent the circuit in an operating state from being observed, hence to protect the operating state of the circuit from analysis for the purpose of illegal act.

(3) The Japanese Publication for Laid-Open Patent Application No. 270562/1998 (Tokukaihei 10-270562 [Date of Publication: Oct. 9, 1998]) discloses a structure as shown in FIG. 16. This structure has a multi-wiring structure in which a polysilicon gate and a wiring 62 are formed on a silicon substrate 61 and a metallic first layer wiring 64 and a metallic second layer wiring 66 are formed on insulating films 63 and 65, respectively. Incidentally, the metallic second layer wiring 66 is covered with a passivation film 67. Above the insulating film 65, an opaque conductive shielding film 60 is formed in the same layer where the metallic second layer wiring 66 is provided, with a gap kept therebetween.

In this structure, the integrated circuit is shielded by the conductive shielding film 60, and further, removal of the conductive shielding film 60 results in breaking the wirings in the same layer. By providing a system to prevent the inner part of integrated circuit from optically being observed, the reverse engineering of a semiconductor integrated circuit is prevented.

The above-described structures, however, have the following problems.

In the structure of (1), since the upper layer 42b made of the same material as that of the lower layer 42a is present on the metallic film 43, stopping the etching of the protective film 42 when the metallic film 43 is exposed makes it possible to etch exclusively the metallic film 43. This allows to make the lower circuit structure observable, thereby making analysis of the circuit possible.

The structure of (2) is intended to damage the wirings upon removable of the shielding metallic film so as to prevent analysis of the circuit operations. After chemically or physically removing a protective film above the shielding layer 54 and the connecting layers 55 and 56 in the same layer, photolithography may be applied to expose only the shielding layer 54, whereby removal of only the shielding layer 54 as shielding metallic film is enabled. In the structure of (3) as well, the conductive shielding layer 60 can be removed in an identical manner.

Thus conventionally available are the methods that easily overcome the schemes for preventing a circuit from being copied, duplicated and for preventing recorded information from being altered, and hence complete protection of circuit information is difficult.

SUMMARY OF THE INVENTION

An object of the present invention is to provide a semiconductor device that effectively prevents observation of the circuit, and surely protects the internal circuit from analysis.

To achieve the foregoing object, a semiconductor device of the present invention includes (i) a circuit section formed on a semiconductor substrate, (ii) a main body wiring that is provided on the semiconductor substrate and that is connected with the circuit section, (iii) a light blocking film provided so as to cover a principal part of the circuit section, and (iv) a coating film that is laminated so as to completely cover the light blocking film and that is made from a film material having corrosion resistance.

With the foregoing arrangement wherein the light blocking film that has a light blocking property thereby exhibiting poor permeability with respect to visible light and far infrared radiation is provided so as to cover the principal part of the circuit section, recognition of the lower circuit pattern can be made impossible. Further, since the coating film is made from a material having corrosion resistance, it is difficult to remove the coating film with use of a liquid chemical or the like.

Alternatively, a semiconductor device of the present invention may include (i) a circuit section formed on a semiconductor substrate, (ii) a main body wiring that is provided on the semiconductor substrate and that is connected with the circuit section, and (iii) a light blocking film that is laminated so as to cover a principal part of the circuit section and that exhibits corrosion resistance.

The foregoing arrangement in which the light blocking film has corrosion resistance makes the light blocking film unremovable. Moreover, since the light blocking film is provided so as to cover the circuit section, it is possible to make the lower circuit pattern invisible. Besides, another corrosion-resistive film for protecting a light blocking becomes unnecessary.

For a fuller understanding of the nature and advantages of the invention, reference should be made to the ensuing detailed description taken in conjunction with the accompanying drawings.

DESCRIPTION OF THE PREFERRED EMBODIMENTS

[First Embodiment]

The following description will depict a first embodiment of the present invention while referring to FIGS. 1 through 5(l).

Figure 1:
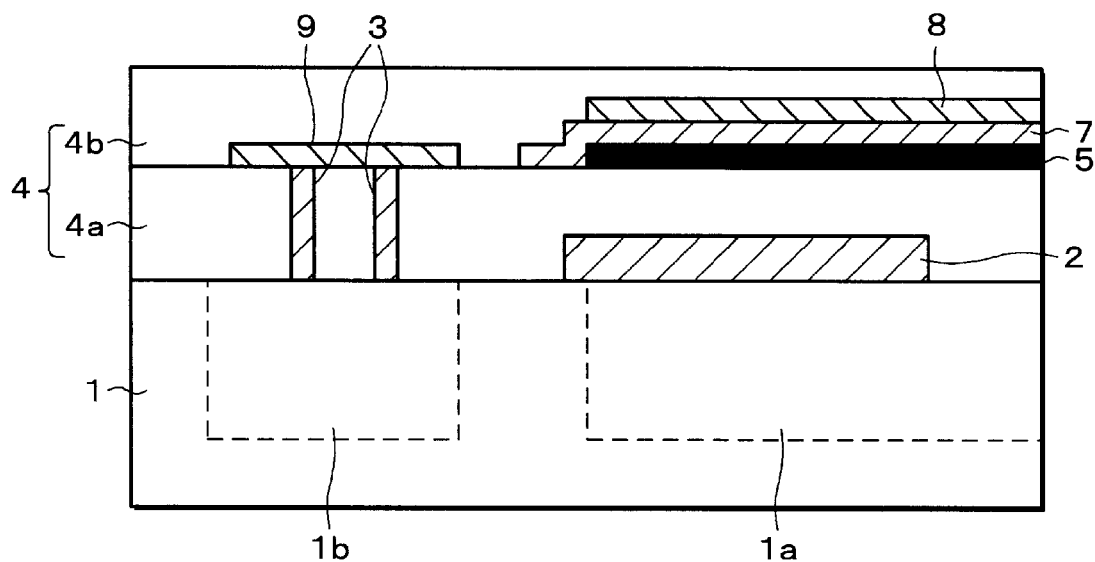
FIG. 1 a cross-sectional view illustrating a structure of a principal part of a semiconductor device in accordance with an embodiment of the present invention.

FIG. 1 is a cross-sectional view illustrating a principal part of a semiconductor device in accordance with an embodiment of the present invention. On a semiconductor substrate 1 composed of a circuit principal part (circuit section) 1a and a resistance detecting circuit part (resistance detecting circuit) 1b provided on a silicon substrate, wirings (main body wirings) 2 are provided for connecting semiconductor elements in the circuit principal part 1a on the semiconductor substrate 1.

Figure 2:
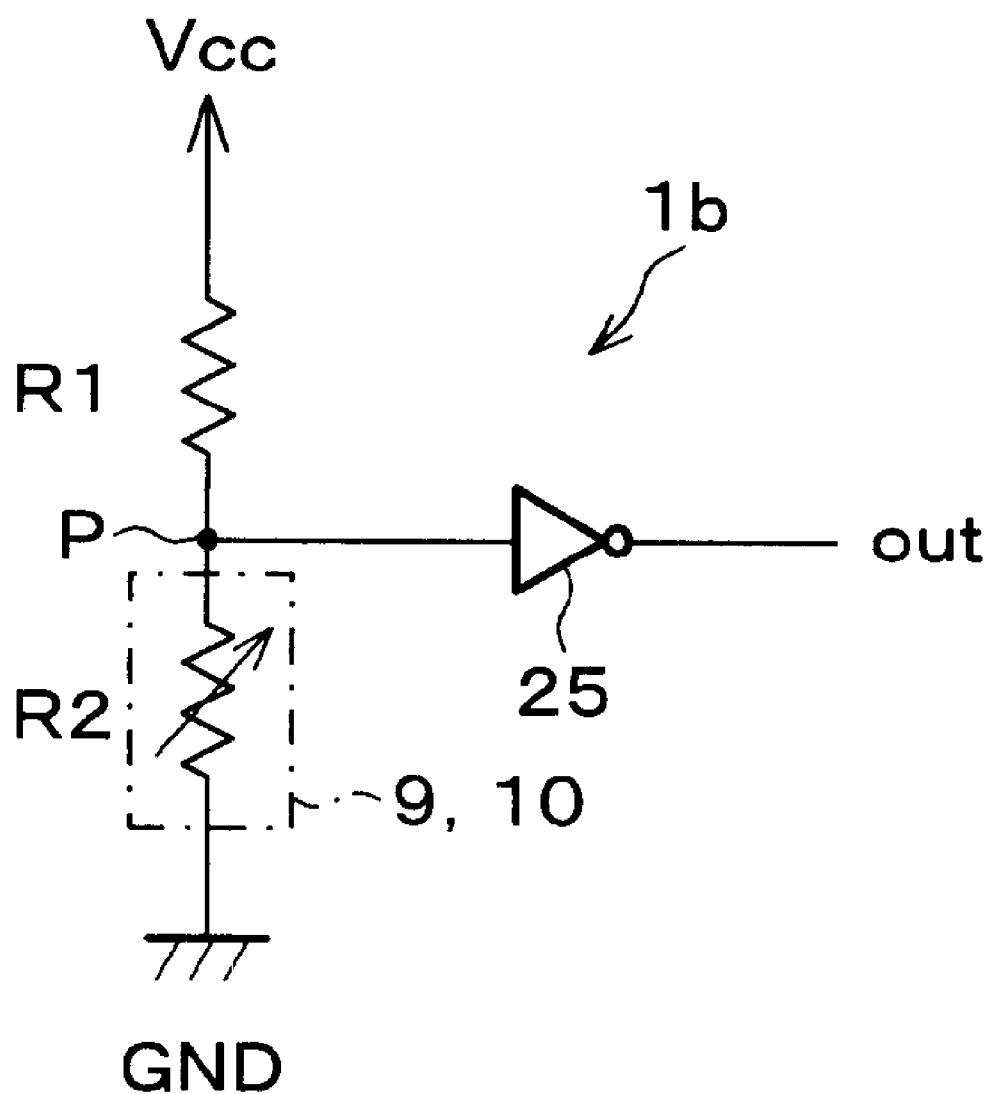
FIG. 2 is a circuit diagram illustrating an arrangement of a resistance detecting circuit part.

The circuit principal part 1a is a principal part of the circuit section that requires security protection. Further, An example of the resistance detecting circuit part 1b is illustrated in FIG. 2.

The resistance detecting circuit part 1b is provided with a resistor R1 and an inverter element 25. The resistor R1 is directly connected with a resistor R2 that constitutes a resistance-detection-use upper wiring 9 that will be described later, and a node P therebetween is connected with an input terminal of the inverter element 25. Further, the other end of the resistor R1 is connected with a power source line with a voltage $V_{CC}$, and the other end of the resistor R2 is grounded (GND). The inverter element 25 inverts a voltage level at the node P and output the inverted result.

The resistor R2 is a resistance component that the resistance-detection-use upper wiring 9 (and a resistance-detection-use light-blocking upper wiring 10 that will be described later) possesses, and its resistance increases if the wiring is removed. A resistor R1 is formed as a resistor under an insulating protective film 4, while the inverter element 25 is provided there as well. Here, the resistor R2 has a resistance that is set lower than a resistance of the resistor R1.

The inverter element 25, in a normal state, outputs an output signal OUT at a high level since the node P has a potential smaller than an inversion threshold value of the inverter element 25. On the other hand, the inverter element 25 outputs an output signal OUT at a low level in the case where the resistance of the resistor R2 increases thereby causing the potential of the node P exceeds the inversion threshold value of the inverter element 25.

To protect the part lower than the wiring 2, the entirety of the upper layer of the semiconductor substrate 1 is covered with the insulating protective film 4, under which the wiring 2, the resistance-detection-use upper wiring (resistance wiring, first wiring section) 9, a light blocking film 5, an aluminum oxide film (coating film) 7, and a light-blocking-use upper wiring (resistance wiring, second wiring section) 8 are provided. The insulating protective film 4 is composed of a lower protective film 4a that is provided on the semiconductor substrate 1, and an upper protective film 4b that is provided on the lower protective film 4a. The resistance-detection-use upper wiring 9 is provided on the protective film 4a, and is connected with the resistance detecting circuit part 1b via a connecting section 3 that pierces the protective film 4a. The light blocking film 5 is, like the resistance-detection-use upper wiring 9, provided on the protective film 4a so as to cover the circuit principal part 1a. The aluminum oxide film 7 is provided so as to completely cover the light-blocking film 5, and the light-blocking-use upper wiring 8 is further provided on the aluminum oxide film 7.

The light blocking film 5 is a conductive metal film, and has a light-blocking property for hardly transmitting at least visible light and infrared radiation light, therefore protects the circuit principal part 1a from observation. Further, since the light-blocking-use upper wiring 8 also has a light-blocking property, the provision of the light-blocking-use upper wiring 8 so as to cover the circuit principal part 1a more effectively prevents the same from being observed. Furthermore, by coloring the aluminum oxide film 7 so as to render the same a light blocking property, it is possible to lower the visibility of the lower layer circuit patterns.

Since aluminum oxide is a material that exhibits insularity and extremely high corrosion resistance, the provision of the aluminum oxide film 7 on the light blocking film 5 ensures that the aluminum oxide film 7 prevents the light blocking film 5 from being chemically exfoliated by a liquid chemical or the like. Besides, since the light-blocking-use upper wiring 8 and the resistance-detection-use upper wiring 9 are formed with the same material, they can be formed through one and same process. Moreover, since the material is inferior in terms of corrosion resistance to the aluminum oxide film 7, the resistance-detection-use upper wiring 9 is corroded by a liquid chemical before the aluminum oxide film 7 is, in the case where removal of the aluminum oxide film 7 is carried out with use of a liquid chemical.

In the case where the resistance-detection-use upper wiring 9 is broken or thinned in result of corrosion, the resistance of the resistor R2 increases thereby raising the potential of the node P, and the output signal OUT is inverted when the potential exceeds the inversion threshold value of the inverter element 25. This causes the resistance detecting circuit section 1b to detect the increase of the resistance, then causing a CPU incorporated in the main circuit to recognize a change of the signal, so that malfunction or inoperativeness of the main body should be caused by software, or so that malfunction of the circuit should be caused by the extraordinary increase in the resistance of the resistor R2 itself.

Thus, chemical exfoliation (liquid chemical removal) of the light-blocking-use upper wiring 8 to attempt to observe the circuit principal part 1a could break or thin the resistance-detection-use upper wiring 9 formed with the same material as that for the light-blocking-use upper wiring 8, resulting in an increase in the resistance of the resistance-detection-use upper wiring 9. Therefore, malfunction or inoperativeness of the main circuit may be caused in response to detection of the foregoing increase in the resistance by the resistance detecting circuit part 1b, or alternatively, a malfunction of the circuit may be caused in response to the abnormal increase in the resistance of the resistance-detection-use upper wiring 9 per se.

The foregoing structure first of all makes it impossible to observe the internal circuit from the external, and further, the structure is arranged so that, upon an attempt to exfoliate the film of the resistance-detection-use upper wiring 9, the circuit should become unable to normally operate. Thus, the semiconductor device arranged as above can provide prevention of analysis of the internal circuit.

The following description will depict a process of fabrication of a semiconductor device of the present embodiment, while referring to process flow diagrams shown in FIGS. 3(a) through 3(k).

Figure 3A:
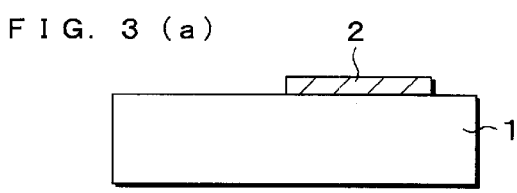
FIGS. 3(a) through 3(k) are process flow diagrams illustrating a process for fabricating the semiconductor device shown in FIG. 1.
Figure 3B:
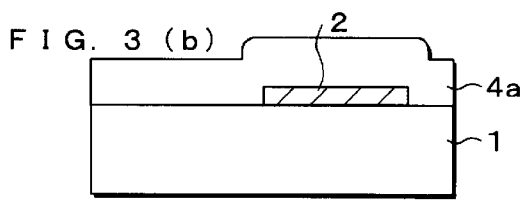
Figure 3C:
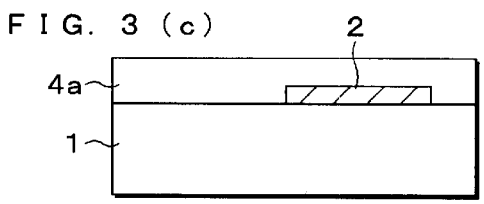
Figure 3D:
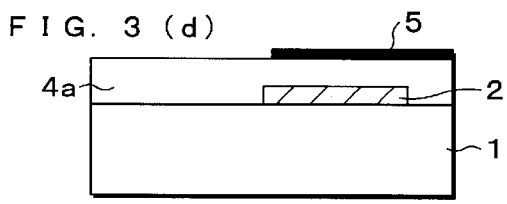
Figure 3E:
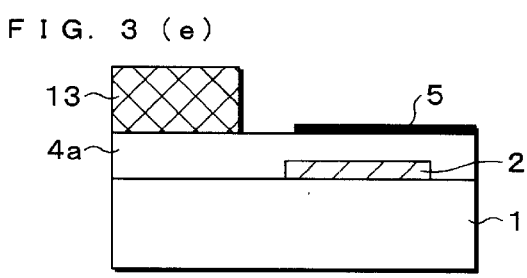

First of all, as shown in FIG. 3(a), a conductive metal film made of aluminum or another metal is formed to a thickness of 900 nm by sputtering, for instance, on the semiconductor substrate 1 having the circuit principal part 1a, followed by resist patterning or dry etching, so that the wiring 2 is formed. On the wiring 2, a protective film 4a is formed with silicon oxide, silicon nitride, or the like to a thickness of 2000 nm by the plasma CVD method (hereinafter referred to as P-CVD method) (FIG. 3(b)). A surface of the foregoing protective film 4a is flatten by removing a raised portion thereof above the wiring 2, for instance, by a thickness of 1000 nm by the CMP (chemical mechanical polishing) method so that surface should be flattened by eliminating unevenness (FIG. 3(c)).

Next, the light blocking film 5 is formed with either (i) a conductive metal film made of the same material as that of the wiring 2 or another material, or (ii) a thin film made from a material having a light blocking property and conductivity identical to those of a metal. For instance, a titanium nitride film is formed to a thickness of 300 nm by sputtering, followed by the patterning of the thin film by resist patterning or dry etching, so that the light blocking film 5 is formed to a desired shape on the circuit principal part 1a (FIG. 3(d)). Patterning is carried out with use of a resist 13 that covers surface portions of the protective film 4a where the light blocking film 5 is absent (FIG. 3(e)). Here, in order that portions that will become the aluminum oxide film 7 should be completely covered with the light blocking film 5, pattern end portions of the resist 13 are more or less distanced from the light blocking film 5.

Figure 3F:
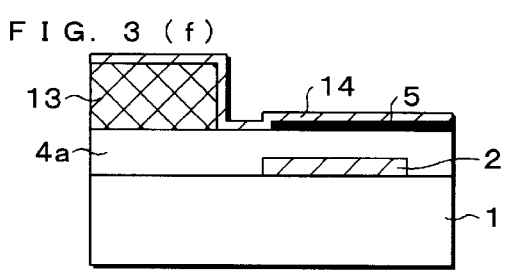
Figure 3G:
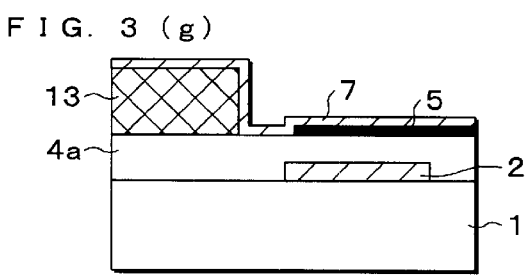
Figure 3H:
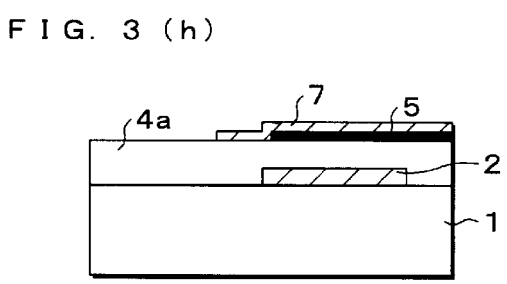

The aluminum film 14 is formed to a thickness of 150 nm over an entirety of the substrate by sputtering, for instance (FIG. 3(f)). Subsequently, oxidation of the foregoing aluminum film 14 is carried out by anodization. The substrate is soaked in an electrolyte of ammonium tartrate or the like, and a plus voltage of about several tens volts is applied to the aluminum film 14 on the substrate, so that the portion corresponding to the thickness of the aluminum film 14 is oxidated. Since the oxidated film has micropores, it is soaked in boiled pure water for sealing the micropores. Through the foregoing process, the aluminum oxide film 7 is formed over an entirety of the substrate (FIG. 3(g)).

The aluminum oxide film 7 may be colored by immersion in a dye liquid prior to the foregoing sealing process. Since the aluminum oxide film 7 prior to the sealing process is microporous, having micropores, dye molecules adhere into pores when the aluminum oxide film 7 is immersed in the dye liquid, whereby it is dyed. A dye used herein is selected from the group of dyes including acidic dyes, acidic metal complex salts, and acidic mordants. To focus on chemical structures, examples of the dye used herein include monoazo dye, disazo dye, anthraquinone dye, phthalocyanine dye, triphenylmethane dye, etc. Control of a quantity of dye adhering to the aluminum oxide film 7 is carried out by adjusting a dyeing time while the substrate is immersed in a dye liquid of a certain set concentration.

After causing the dye to adhere to the aluminum oxide film 7, the substrate is immersed in boiled pure water for sealing the pores. This fixes the dye on the aluminum oxide film 7, whereby the aluminum oxide film 7 is dyed. By thus dying the aluminum oxide film 7, it is possible to make it more difficult to observe the internal circuit from the external.

Furthermore, by scrubbing the substrate surface, the aluminum oxide film 7 is scraped off in regions from where step coverage of the oxide film is poor in the vicinity of the bottom of the resist 13 to above the resist 13, and thereafter the resist 13 is removed by means of a stripping liquid. In the case where aluminum oxide patterns thus formed have burrs, the burrs are removed by scrubbing the substrate surface in the foregoing state (lift-off method), followed by the washing. The aluminum oxide film 7 is thus formed on the light blocking film 5 (FIG. 3(h)).

Figure 3I:
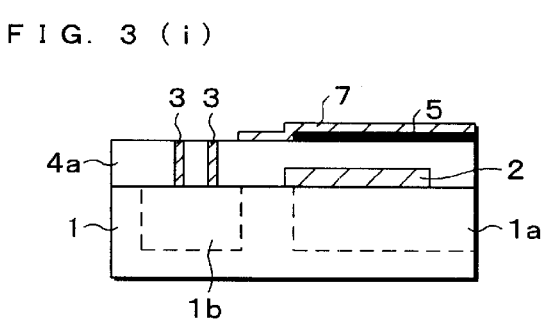
Figure 3J:
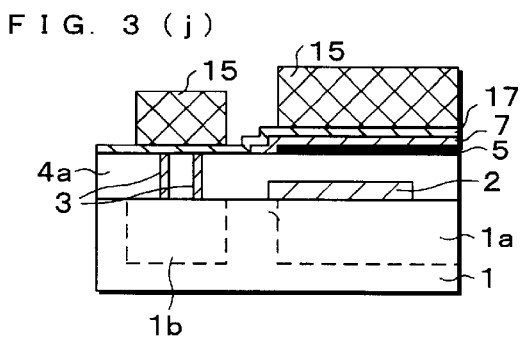
Figure 3K:
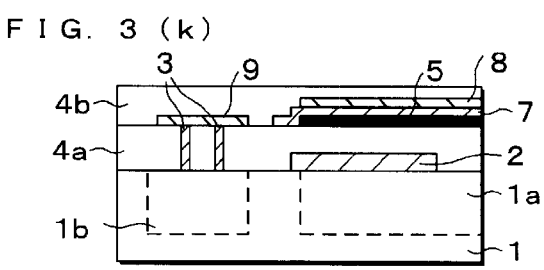

Then, the protective film 4a on the light blocking film 5 is subjected to patterning and etching, and tungsten plug is provided, whereby the connecting sections 3 are formed (FIG. 3(i)). Thereafter, the light-blocking-use upper wiring 8 and the resistance-detection-use upper wiring 9 are formed with either (i) a conductive metal film made from the same material as that for the light blocking film 5 or another material, that is, a material inferior to the aluminum oxide film 7 in terms of corrosion resistance, or (ii) a thin film made from a material that has a light blocking property and conductivity identical to those of a metal. For instance, a titanium nitride film 17 is formed to a thickness of 300 nm by sputtering, and a resist 15 is formed thereon. Then, patterning and dry etching are carried out with use of the resist 15, so that portions constituting the light-blocking-use upper wiring 8 and portions constituting the resistance-detection-use upper wiring 9 are simultaneously formed on the circuit principal part 1a and on the resistance detecting circuit part 1b, respectively (FIG. 3(j)). Finally, the protective film 4b is formed, for instance, to a thickness of 300 nm by the P-CVD method (FIG. 3(k)).

Through the foregoing process, the structure shown in FIG. 1 is produced. Thus, the semiconductor circuit structure shown in FIG. 1 is easily realized by a conventional processing technique.

Figure 4:
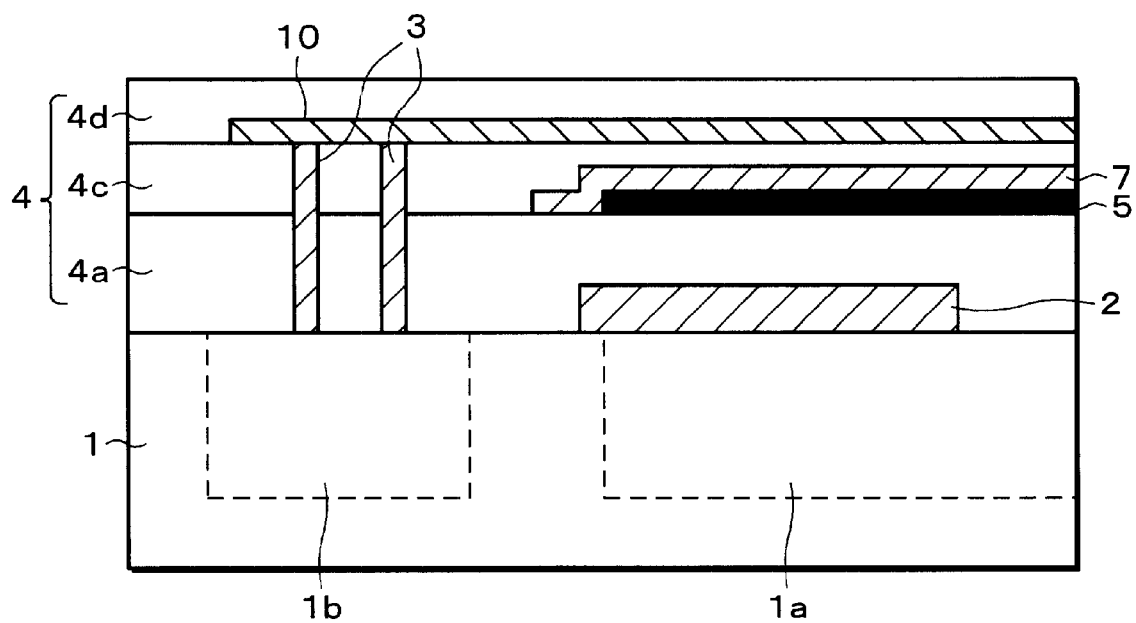
FIG. 4 is a cross-sectional view illustrating a structure of a principal part of another semiconductor device in accordance with the embodiment of the present invention.

Incidentally, the semiconductor device of the first embodiment shown in FIG. 1 is provided with the light-blocking-use upper wiring 8 and the resistance-detection-use upper wiring 9 that are electrically separated by patterning, but instead of these the semiconductor device may be provided with a resistance-detection-use light-blocking-use upper wiring 10 for resistance detection and for light blocking both, as shown in FIG. 4 (cross-sectional view of a principal part of the semiconductor device).

The foregoing resistance-detection-use light-blocking upper wiring 10 is provided above the aluminum oxide film 7 though the insulating protective film 4 is provided therebetween, and is connected with the foregoing resistance detecting circuit part 1b via the connecting section 3. Note that the insulating protective film 4 has protective films 4c and 4d in the place of the foregoing protective film 4b. The protective film 4c is formed on the protective film 4a so as to cover the aluminum oxide film 7. The protective film 4d is formed on the protective film 4c so as to cover the resistance-detection-use light-blocking upper wiring 10 formed on the protective film 4c.

The resistance-detection-use light-blocking upper wiring 10 has both functions as an element that detects a change in the resistance (resistance-detection-use upper wiring 9) and as a film having a light blocking property (light-blocking-use upper wiring 8). Therefore, an attempt to physically (by polishing, etc.) or chemically (by processing with a liquid chemical, etc.) remove the resistance-detection-use light-blocking upper wiring 10 in order to observe the circuit principal part 1a causes the resistance-detection-use light-blocking upper wiring 10 to break or thin, resulting in an increase in its resistance. This causes the resistance detecting circuit part 1b to more sensitively operate, as compared with the structure shown in FIG. 1.

Here, the following description will depict a process of fabrication of the semiconductor device arranged as above, while referring to process flow diagrams shown in FIGS. 5(a) through 5(l). However, the steps until formation of the aluminum oxide film 7 (FIGS. 5(a) through 5(h)) are identical to those (FIGS. 3(a) through 3(h)) in the fabrication process for the semiconductor device shown in FIG. 1. Therefore the explanation about the same is omitted, and the steps subsequent to the same are explained below.

Figure 5A:
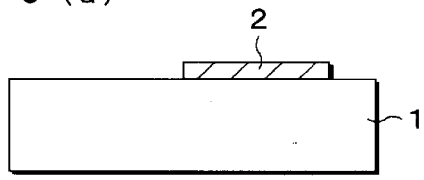
FIGS. 5(a) through 5(l) are process flow diagrams illustrating a process for fabricating the semiconductor device shown in FIG. 4.
Figure 5B:
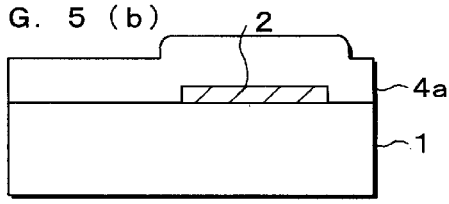
Figure 5C:
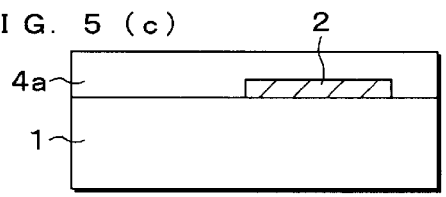
Figure 5D:
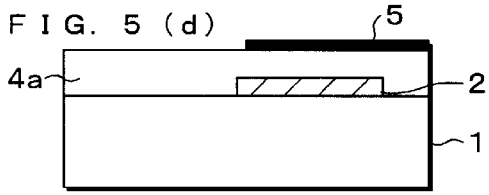
Figure 5E:
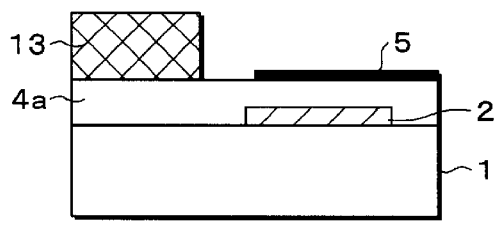
Figure 5F:
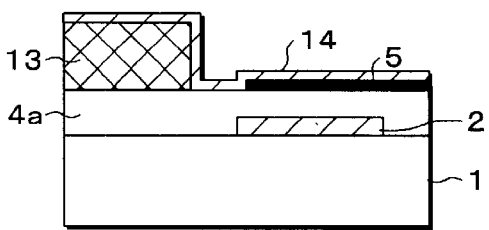
Figure 5G:
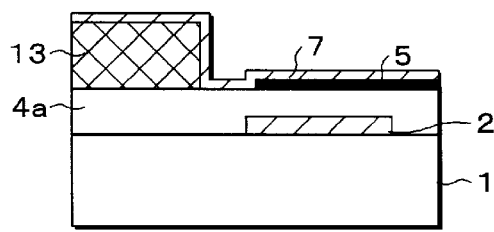
Figure 5H:
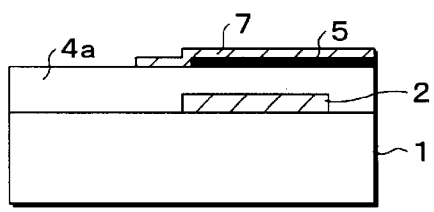
Figure 5I:
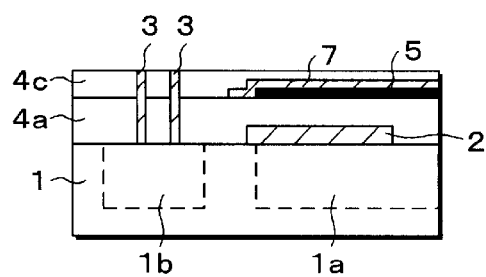
Figure 5J:
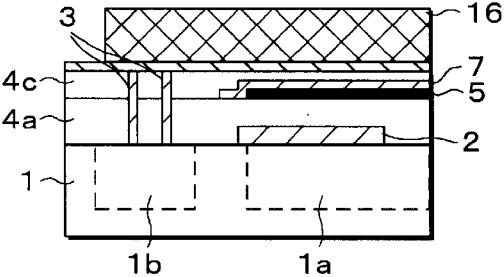
Figure 5K:
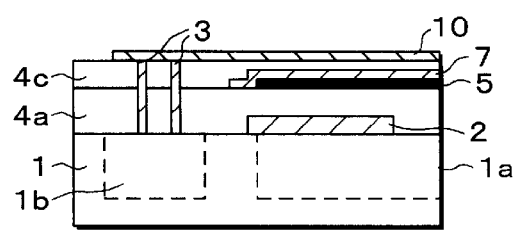
Figure 5L:
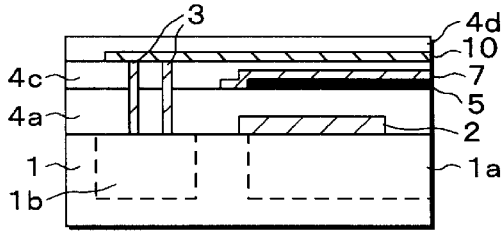

The insulating protective film 4c is formed on the protective film 4a, for instance, to a thickness of 300 nm by the P-CVD method, so as to cover the aluminum oxide film 7, while the resistance detecting circuit part 1b is subjected to patterning and etching and tungsten plug is provided, whereby the connecting sections 3 are formed (FIG. 5(i)). Thereafter, the resistance-detection-use light-blocking upper wiring 10 is formed with either (i) a conductive metal film made from the same material as that for the light blocking film 5 or another material, that is, a material inferior to the aluminum oxide film 7 in terms of corrosion resistance, or (ii) a thin film made from a material that has a light blocking property and conductivity identical to those of a metal. For instance, a titanium nitride film is formed to a thickness of 300 nm by sputtering, and a resist 16 is formed thereon (FIG. 5(j)). With the resist 16, patterning, dry etching, and resist stripping are carried out so that the resistance-detection-use light-blocking upper wiring 10 should be formed on the circuit principal part 1a and on the resistance detecting circuit part 1b (FIG. 5(k)). Finally, the insulating protective film 4*d* is formed, for instance, to a thickness of 300 nm by the P-CVD method (FIG. 5(*l*)). Thus, the structure shown in FIG. 4 is fabricated.

[Second Embodiment]

The following description will explain a second embodiment of the present invention while referring to FIGS. 6 through 9(*j*). Incidentally, the members having the same structure (function) as those in the first embodiment will be designated by the same reference numerals and their description will be omitted.

Figure 6:
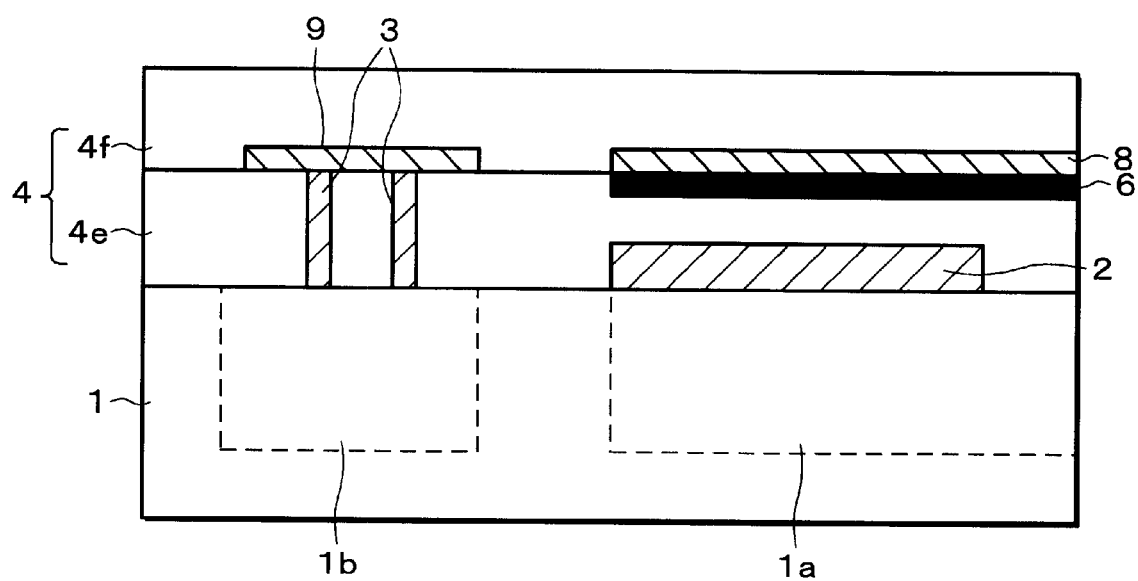
FIG. 6 is a cross-sectional view illustrating a structure of a principal part of a semiconductor device in accordance with another embodiment of the present invention.
Figure 7A:
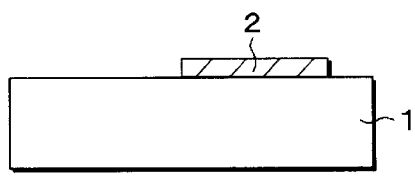
FIGS. 7(a) through 7(j) are process flow diagrams illustrating a process for fabricating the semiconductor device shown in FIG. 6.
Figure 7B:
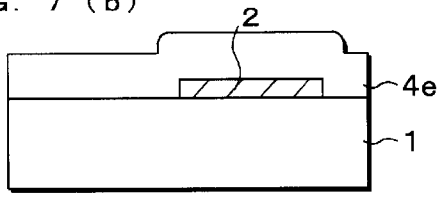
Figure 7C:
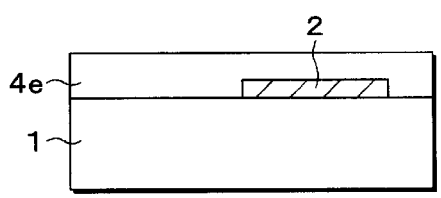
Figure 7D:
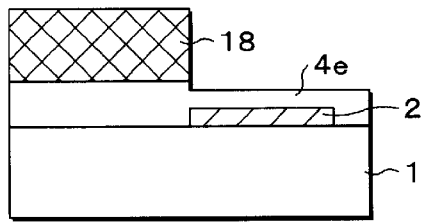
Figure 7E:
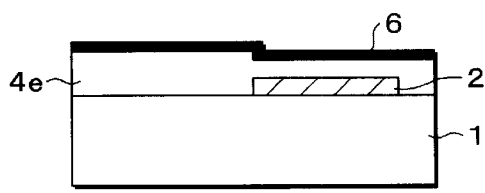
Figure 7F:
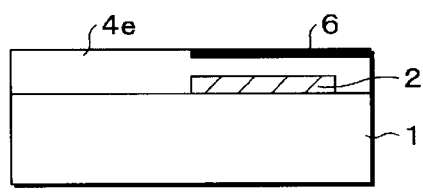
Figure 7G:
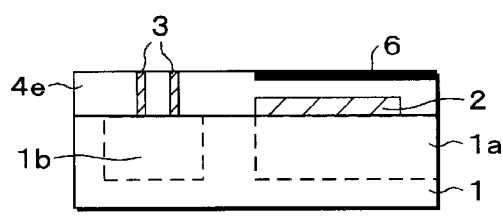
Figure 7H:
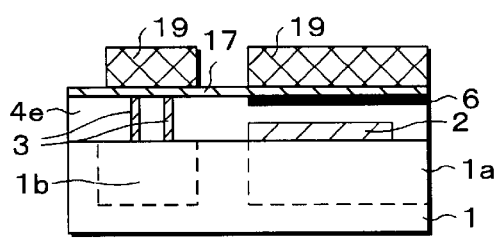
Figure 7I:
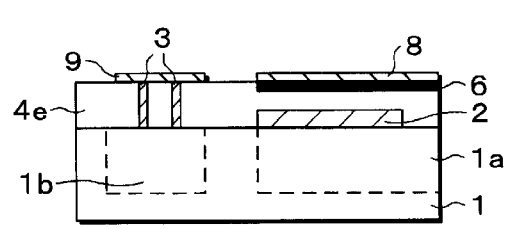
Figure 7J:
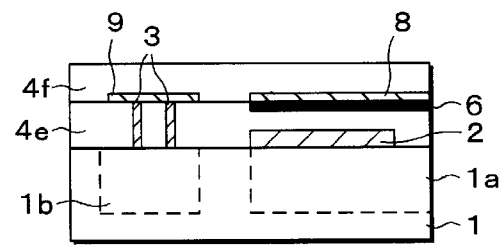

FIG. 6 is a cross-sectional view illustrating a principal part of a semiconductor device in accordance with the second embodiment of the present invention. The semiconductor device in accordance with the present embodiment is, like in the first embodiment, arranged so that a wiring 2, connecting sections 3, an insulating protective film 4, a light-blocking-use upper wiring 8, and a resistance-detection-use upper wiring 9 should be provided on a semiconductor substrate 1 having a circuit principal part 1*a* and a resistance detecting circuit apart 1*b*. Besides, the light-blocking-use upper wiring 8 and the resistance-detection-use upper wiring 9 are provided in the same layer, while a corrosion-resistive light-blocking film 6 that is a light blocking film having a corrosion resistance property is provided on a surface of the light-blocking-use upper wiring 8 on the semiconductor substrate 1 side. The insulating protective film 4 is composed of a lower protective film 4*e* provided on the semiconductor substrate 1 and a protective film 4*f* provided on the protective film 4*e*.

In the semiconductor device arranged as described above, the corrosion-resistive light-blocking film 6, like the light blocking film 5 in the first embodiment, prevents the circuit principal part 1*a* from being observed. Moreover, the use of the corrosion-resistive light blocking film 6 made from a corrosion-resistive metal such as tantalum or niobium, instead of the light blocking film 5, makes it unnecessary to provide an aluminum oxide film 7 as shown in FIG. 1, and the corrosion-resistive light-blocking film 6 per se can be made hardly removable. Thus, the effect of providing invisibility can be enhanced.

The following description will depict a process of fabrication of a semiconductor device of the present embodiment, while referring to process flow diagrams shown in FIGS. 7(*a*) through 7(*j*).

First of all, as shown in FIG. 7(*a*), a conductive metal film made of aluminum or another metal is formed to a thickness of 900 nm by sputtering, for instance, on the semiconductor substrate 1 having the circuit principal part 1*a*, followed by resist patterning or dry etching, so that the wiring 2 is formed. On the wiring 2, a protective film 4*e* is formed with silicon oxide, silicon nitride, or the like to a thickness of 2000 nm by the P-CVD method (FIG. 7(*b*)). A surface of the foregoing protective film 4*e* is flatten by removing a raised portion thereof above the wiring 2 by a thickness of 1000 nm by the CMP method so that surface should be flattened by eliminating unevenness (FIG. 7(*c*)).

Next, with use of a resist 18, a surface of the protective film 4*e* is subjected to patterning and dry etching, so as to have a recess above the principal circuit part 1*a* (FIG. 7(*d*)). A depth of the recess is preferably substantially equal to a thickness of the corrosion-resistive light-blocking film 6 to be formed. Subsequently, the corrosion-resistive light-blocking film 6 is formed with tantalum or niobium throughout an entirety of the semiconductor substrate 1 by sputtering so as to have a thickness of 150 nm (FIG. 7(*e*)). The corrosion-resistive light-blocking film 6 is scraped off by the metal CMP method by a thickness corresponding to the thickness of the film 6 (FIG. 7(*f*)). By so doing, the corrosion-resistive light-blocking film 6 remains only in the recess in the protective film 4*e*, while being removed from the other areas.

Then, the protective film 4*e* on the resistance detection circuit part 1*b* is subjected to patterning and etching, and tungsten plug is provided thereon, whereby the connecting sections 3 are formed (FIG. 7(*g*)). Thereafter, the light-blocking-use upper wiring 8 and the resistance-detection-use upper wiring 9 are formed with either (i) a conductive metal film made from a material inferior to the corrosion-resistive light-blocking film 6 in terms of corrosion resistance, or (ii) a thin film made from a material that has a light blocking property and conductivity identical to those of a metal. For instance, a titanium nitride film 17 is formed to a thickness of 300 nm by sputtering (FIG. 7(*h*)), and with use of a resist 19 formed thereon, patterning carried out (FIG. 7(*i*)). Finally, a protective film 4*f* is formed, for instance, to a thickness of 300 nm by the P-CVD method (FIG. 7(*j*)).

Through the foregoing process, the structure shown in FIG. 6 is fabricated. The semiconductor circuit structure shown in FIG. 6 is thus easily realized by the conventional processing technique.

Figure 8:
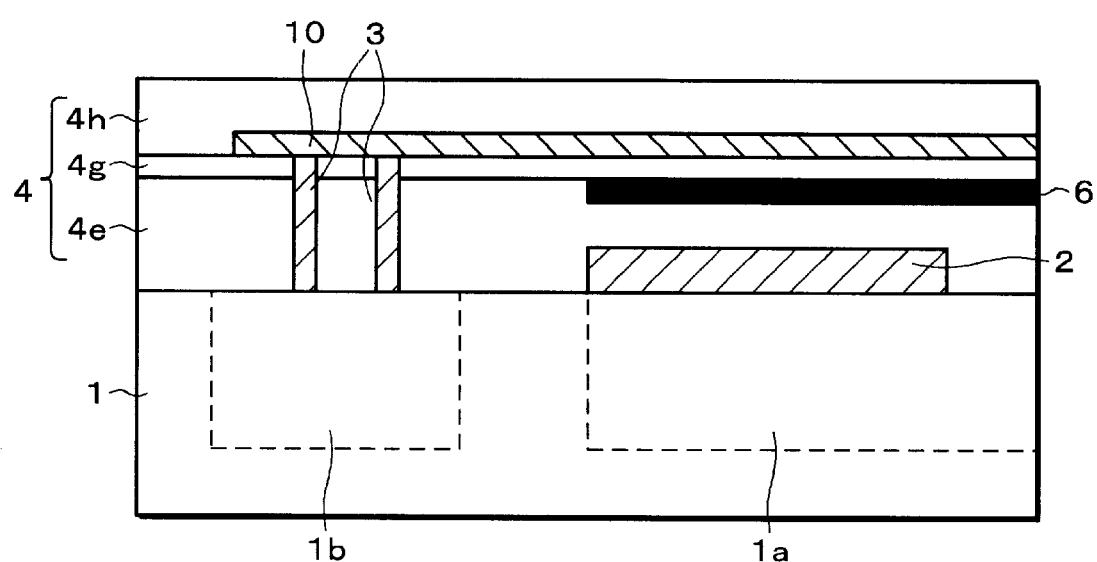
FIG. 8 is a cross-sectional view illustrating a structure of a principal part of a semiconductor device in accordance with the another embodiment of the present invention.
Figure 9A:
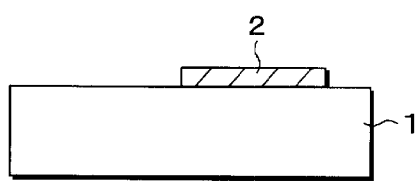
FIGS. 9(a) through 9(j) are process flow diagrams illustrating a process for fabricating the semiconductor device shown in FIG. 8.
Figure 9B:
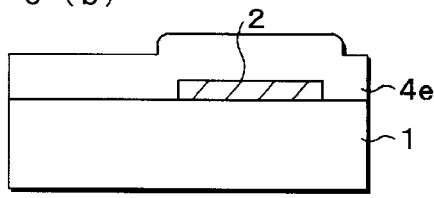
Figure 9C:
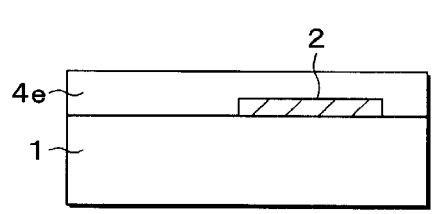
Figure 9D:
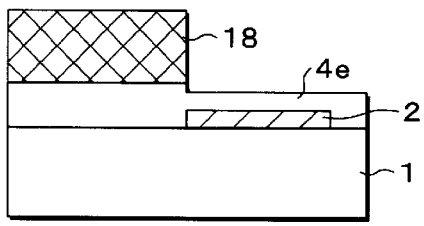
Figure 9E:
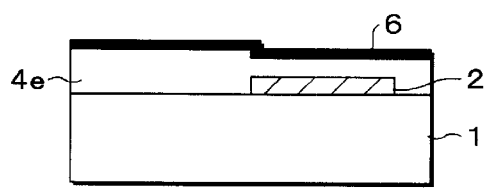
Figure 9F:
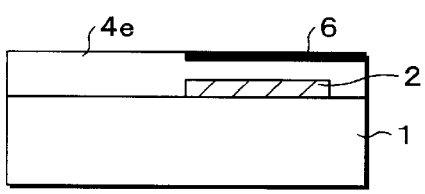
Figure 9G:
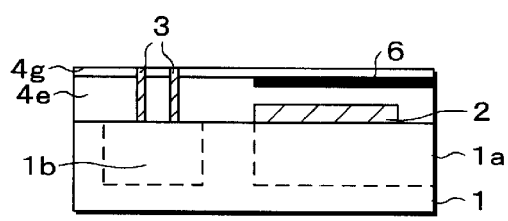
Figure 9H:
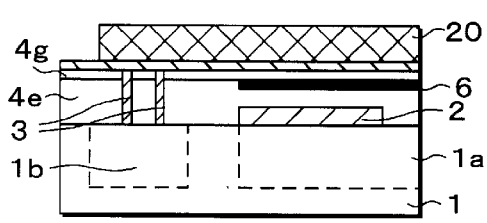
Figure 9I:
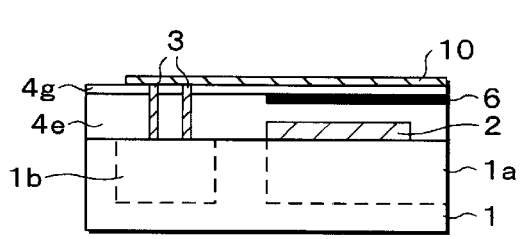
Figure 9J:
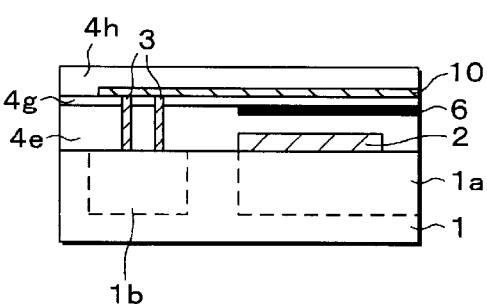

Incidentally, the semiconductor device in accordance with the present embodiment shown in FIG. 6 is provided with the light-blocking-use upper wiring 8 and the resistance-detection-use upper wiring 9 that are electrically separated from each other by patterning, but instead of these the semiconductor device may be provided with a resistance-detection-use light-blocking upper wiring 10 for resistance detection and light blocking both, as shown in FIG. 8 (cross-sectional view of a principal part of the semiconductor device).

The foregoing resistance-detection-use light-blocking upper wiring 10 is provided above the corrosion-resistive light-blocking film 6 though the insulating protective film 4 is provided therebetween, and is connected with the foregoing resistance detecting circuit part 1*b* via the connecting section 3. Note that the insulating protective film 4 has protective films 4*g* and 4*h* in the place of the foregoing protective film 4*f*. The protective film 4*g* is formed on the protective film 4*e* so as to cover the corrosion-resistive light-blocking film 6. The protective film 4*h* is formed on the protective film 4*g* so as to cover the resistance-detection-use light-blocking upper wiring 10 formed on the protective film 4*g*.

The resistance-detection-use light-blocking upper wiring 10 has both functions as an element that detects a change in the resistance (resistance-detection-use upper wiring 9) and as a film having a light blocking property (light-blocking-use upper wiring 8). Therefore, an attempt to physically (by polishing, etc.) or chemically (by processing with a liquid chemical, etc.) remove the resistance-detection-use light-blocking upper wiring 10 in order to observe the circuit principal part 1*a* causes the resistance-detection-use light-blocking upper wiring 10 to break or thin, resulting in an increase in its resistance. This causes the resistance detecting circuit part 1*b* to more sensitively operate, as compared with the structure shown in FIG. 6.

Here, the following description will depict a process of fabrication of the semiconductor device arranged as above, while referring to process flow diagrams shown in FIGS. 9(*a*) through 9(*j*). However, the steps until formation of the corrosion-resistive light-blocking film 6 (FIGS. 9(*a*) through 9(*f*)) are identical to those (FIGS. 7(*a*) through 7(*f*)) in the fabrication process for the semiconductor device shown in FIG. 6. Therefore the explanation about the same is omitted, and the steps subsequent to the same are explained below.

The insulating protective film 4g is formed on the protective film 4e, for instance, to a thickness of 300 nm by the P-CVD method, so as to cover the corrosion-resistive light-blocking film 6. Then, the resistance detecting circuit part 1b is subjected to patterning and etching, and tungsten plug is provided thereon, whereby connecting sections 3 are formed (FIG. 9(g)). Thereafter, the resistance-detection-use light-blocking upper wiring 10 is formed with either (i) a conductive metal film made from a material having corrosion resistance equal or inferior to that of the corrosion-resistive light-blocking film 6, or (ii) a thin film made from a material that has a light blocking property and conductivity identical to those of a metal. For instance, a titanium nitride film is formed to a thickness of 300 nm by sputtering, and then with use of a resist 20 formed thereon, patterning is carried out (FIG. 9(h)). Further, by dry etching with use of the resist 20, the resistance-detection-use light-blocking upper wiring 10 is formed on the circuit principal part 1a (FIG. 9(i)). Finally, a protective film 4h is formed, for instance, to a thickness of 300 nm by the P-CVD method (FIG. 9(j)). Thus, the structure shown in FIG. 8 is fabricated.

[Third Embodiment]

The following description will explain still another embodiment of the present invention, while referring to FIGS. 10 through 13(j). Incidentally, the members having the same structure (function) as those in the first embodiment will be designated by the same reference numerals and their description will be omitted.

Figure 10:
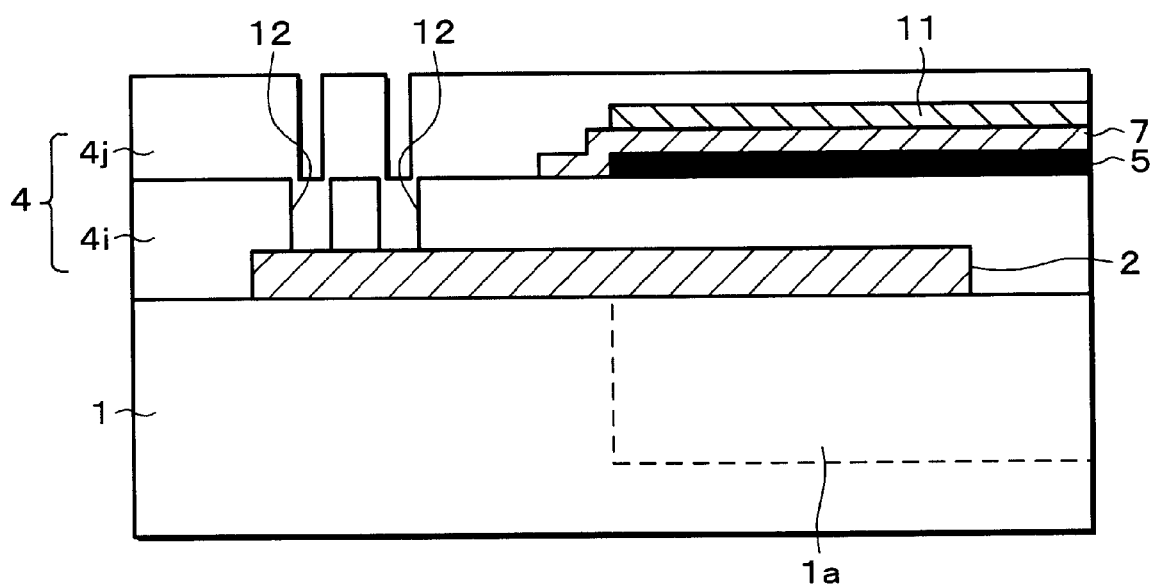
FIG. 10 is a cross-sectional view illustrating a structure of a principal part of a semiconductor device in accordance with still another embodiment of the present invention.

FIG. 10 is a cross-sectional view illustrating a principal part of a semiconductor device in accordance with a still another embodiment of the present invention. On a semiconductor substrate 1 including a circuit principal part 1a formed on a silicon substrate, a wiring 2 to connect semiconductor elements in the circuit principal part 1a is provided.

To protect a part lower than the wiring 2, an insulating protective film 4 covers an entirety of an upper lamination of the semiconductor substrate 1, inside which the foregoing wiring 2, a light blocking film 5, an aluminum oxide film 7, and an upper wiring 11 are formed. The insulating protective film 4 is formed on the semiconductor substrate 1, and is composed of (i) a lower protective film (first insulating protective film) 4i having openings 12, and (ii) an upper protective film (second insulating protective film) 4j that is formed on the protective film 4i and fills the openings 12. The number of the openings in the protective film 4i is not particularly limited. The light blocking film 5 is formed on the protective film 4i in an area such that the light blocking film 5 should cover the circuit principal part 1a. The aluminum oxide film 7 is provided so as to completely cover the light blocking film 5, and the upper wiring 11 is provided on the aluminum oxide film 7.

In the foregoing arrangement, since not only the light blocking film 5 but also the upper wiring 11 have a light blocking property, the provision of the upper wiring 11 so as to cover the circuit principal part 1a more effectively prevents the part 1a from being observed. Furthermore, by dying the aluminum oxide film 7 to render the same a light blocking property, the visibility of the lower circuit pattern can be further lowered.

By providing on the wiring 2 the protective film 4i as the first insulating protective film having the openings 12, and by covering the upper surface of the same with the protective film 4j as the second insulating protective film, an attempt to remove the light blocking part with a liquid chemical for circuit analysis can be made to result in damaging not only the upper wiring 11 but also the wiring 2 that transmits signals from the external to the circuit principal part 1a due to the foregoing liquid chemical. Consequently, the breaking or thinning of the wiring 2 due to damage by the liquid chemical results in an abnormal increase in a resistance thereof, impairing a normal operation of the circuit.

The following description will depict a process of fabrication of the semiconductor device arranged as above, while referring to process flow diagrams shown in FIGS. 11(a) through 11(l).

Figure 11A:
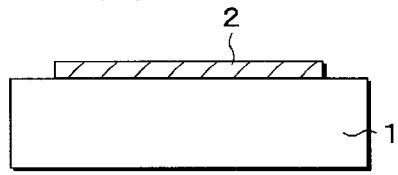
FIGS. 11(a) through 11(l) are process flow diagrams illustrating a process for fabricating the semiconductor device show in FIG. 10.
Figure 11B:
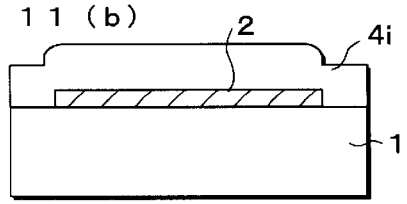
Figure 11C:
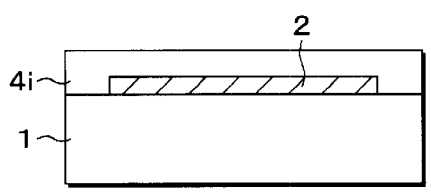
Figure 11D:
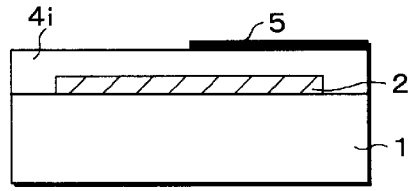
Figure 11E:
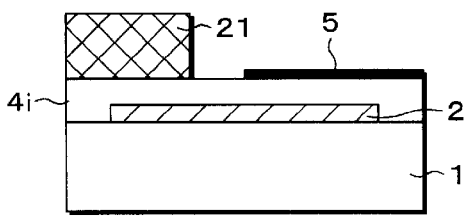

First of all, as shown in FIG. 11(a), a conductive metal film made from aluminum or another material is formed on the semiconductor substrate 1 having the circuit principal part 1a, for instance, to a thickness of 900 nm by sputtering, followed by resist patterning and dry etching to form the wiring 2. On the wiring 2, the protective film 4i is formed with silicon oxide, silicon nitride, or the like, for instance, to a thickness of 2000 nm by the P-CVD method (FIG. 11(b)). A surface of the foregoing protective film 4i is flatten by removing a raised portion thereof above the wiring 2, for instance, by a thickness of 1000 nm by the CMP method, so that surface should be flattened by eliminating unevenness (FIG. 11(c)).

Next, the light blocking film 5 is formed with either (i) a conductive metal film made of the same material as that of the wiring 2 or another material, or (ii) a thin film made of a material having a light blocking property and conductivity identical to those of a metal. For instance, a titanium nitride film is formed to a thickness of 300 nm by sputtering, followed by the patterning of the thin film by resist patterning or dry etching, so that the light blocking film 5 is formed to a desired shape on the circuit principal part 1a (FIG. 11(d)). Patterning is carried out with use of a resist 21 that covers surface portions of the protective film 4e where the light blocking film 5 is absent (FIG. 11(e)). Here, in order that portions that will become the aluminum oxide film 7 should be completely covered with the light blocking film 5, pattern end portions of the resist 21 are more or less distanced from the light blocking film 5.

Figure 11F:
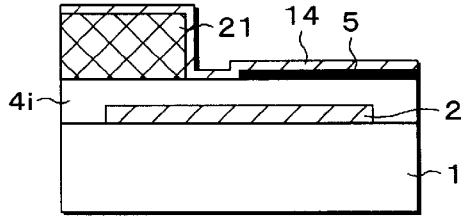
Figure 11G:
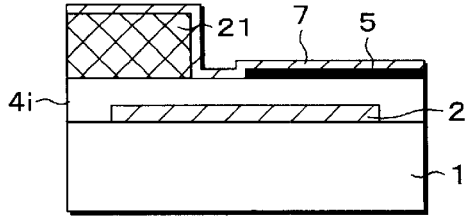
Figure 11H:
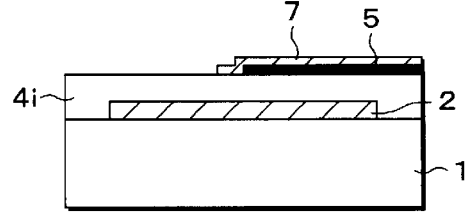
Figure 11I:
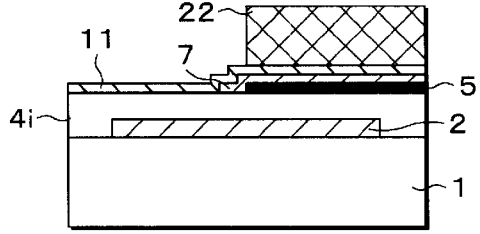
Figure 11J:
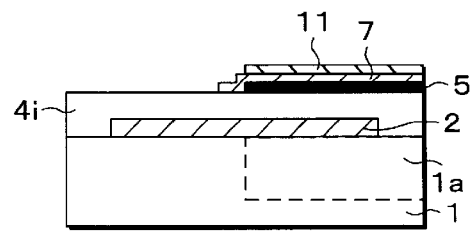

The aluminum film 14 is formed to a thickness of 150 nm over an entirety of the substrate by sputtering, for instance (FIG. 11(f)). Subsequently, oxidation of the foregoing aluminum film 14 is carried out by anodization, whereby the aluminum oxide film 7 is formed over an entirety of the upper surface of the substrate (FIG. 11(g)). Furthermore, by scrubbing the substrate surface, the aluminum oxide film 7 is scraped off in regions from where step coverage of the oxide film is poor in the vicinity of the bottom of the resist 21 to above the resist 21, and thereafter the resist 21 is removed by means of a stripping liquid. In the case where aluminum oxide patterns thus formed have burrs, the burrs are removed by scrubbing the substrate surface in the foregoing state, followed by the washing. The aluminum oxide film 7 is thus formed on the light blocking film 5 (FIG. 11(h)).

Thereafter, the upper wiring 11 is formed with either (i) a conductive metal film made from the same material as that for the light blocking film 5 or another material, that is, a material inferior to the aluminum oxide film 7 in terms of corrosion resistance, or (ii) a thin film made from a material that has a light blocking property and conductivity identical to those of a metal. For instance, a titanium nitride film is formed to a thickness of 300 nm by sputtering, and patterning is carried out with use of a resist 22 (FIG. 11(i)). Then, by dry etching, the upper wiring 11 is formed on the circuit principal part 1a (FIG. 11(j)).

Figure 11K:
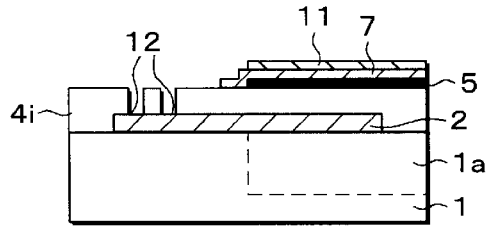
Figure 11L:
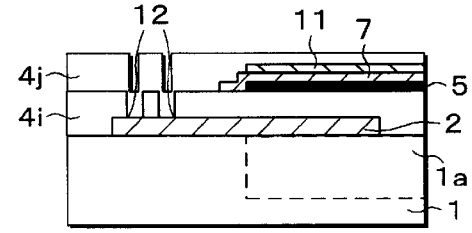

Finally, openings 12 are provided by patterning and etching in the portion of the protective film 4i that covers the wiring 2 (FIG. 11(k)). Then, the protective film 4j is formed thereon, for instance, to a thickness of 300 nm by the P-CVD method (FIG. 11(l)), to cover the openings 12.

Through the foregoing process, the structure shown in FIG. 10 is fabricated. The semiconductor circuit structure shown in FIG. 10 is thus easily realized by the conventional processing technique.

Figure 12:
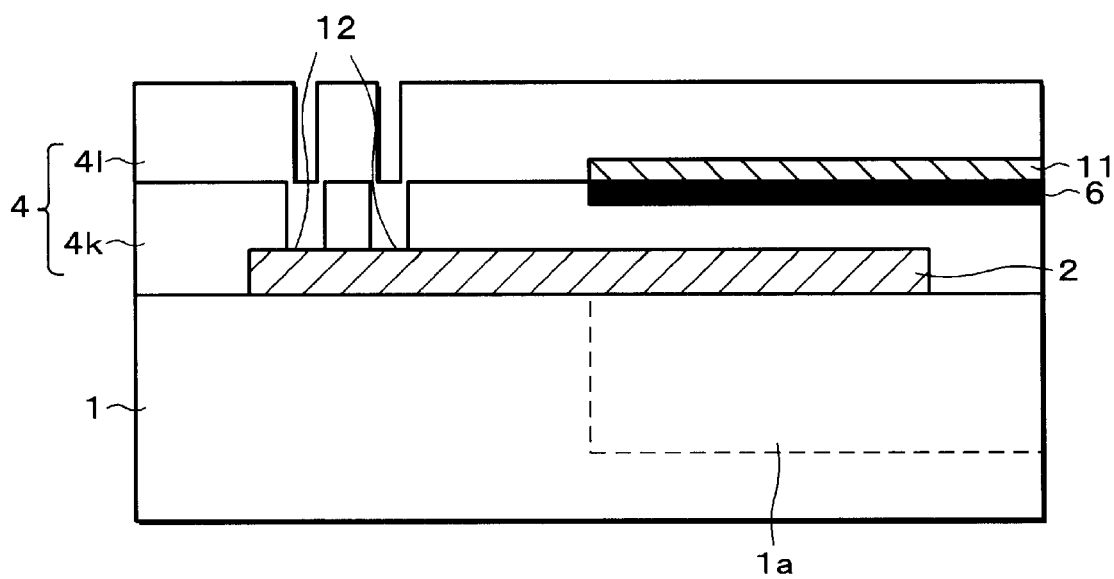
FIG. 12 is a cross-sectional view illustrating a structure of a principal part of a semiconductor device in accordance with the still another embodiment of the present invention.
Figure 13:
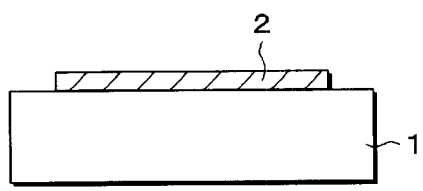
FIGS. 13(a) through 13(j) are process flow diagrams illustrating a process for fabricating the semiconductor device shown FIG. 12.
Figure 13:
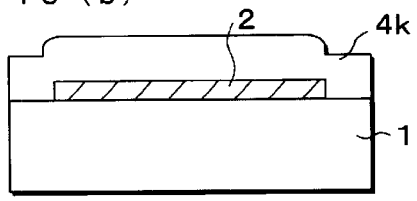
Figure 13:
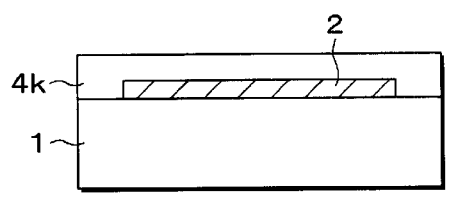
Figure 13:
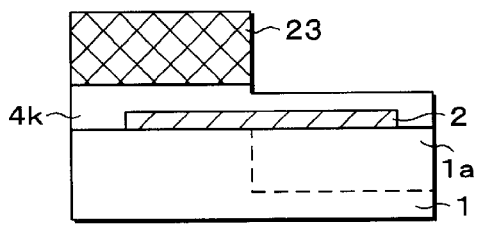
Figure 13:
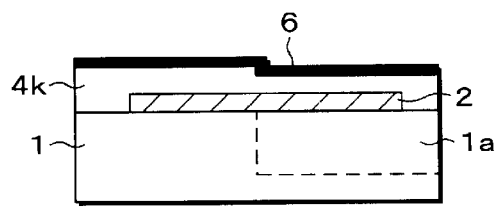
Figure 13:
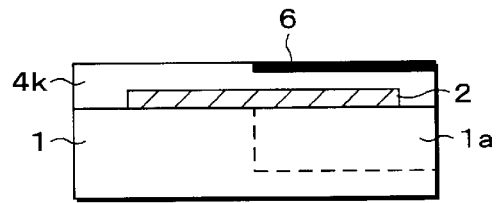
Figure 13:
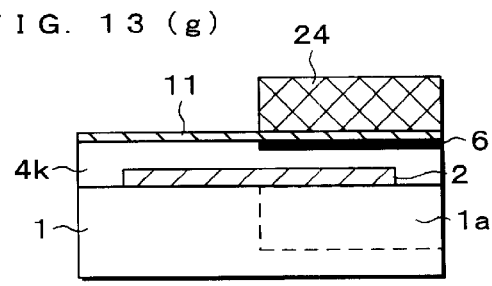
Figure 13:
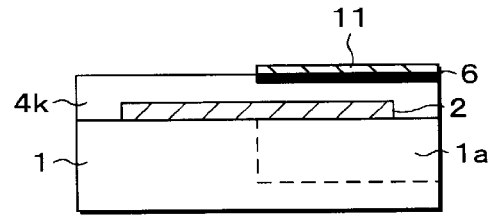
Figure 13:
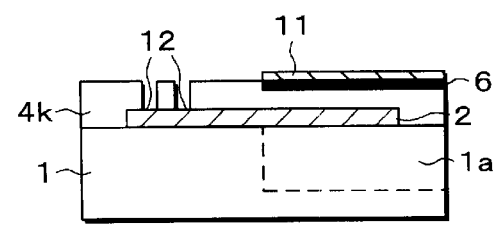
Figure 13:
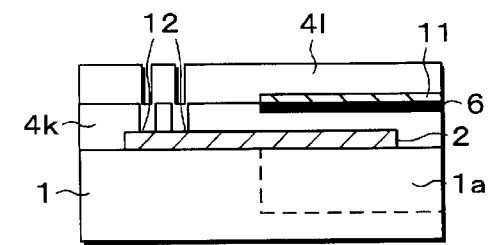
Figure 14:
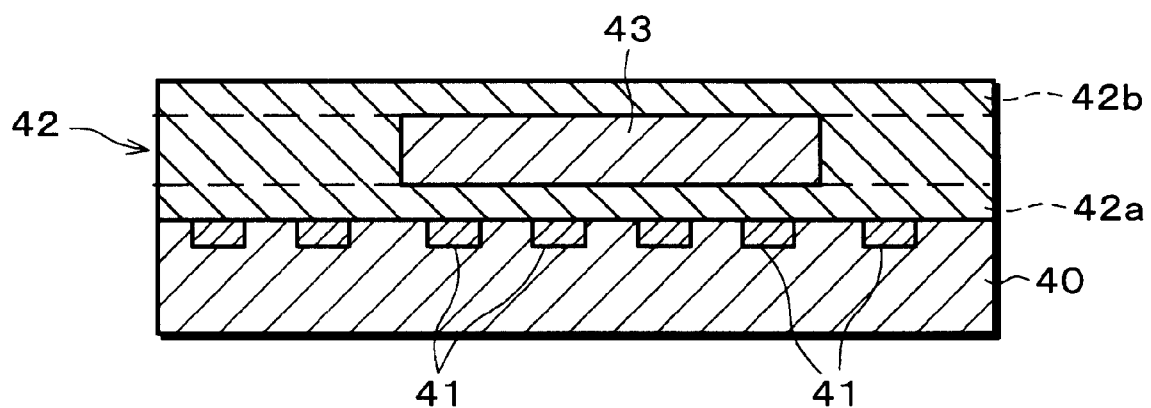
FIG. 14 is a cross-sectional view illustrating a structure of a principal part of a conventional semiconductor device.
Figure 15:
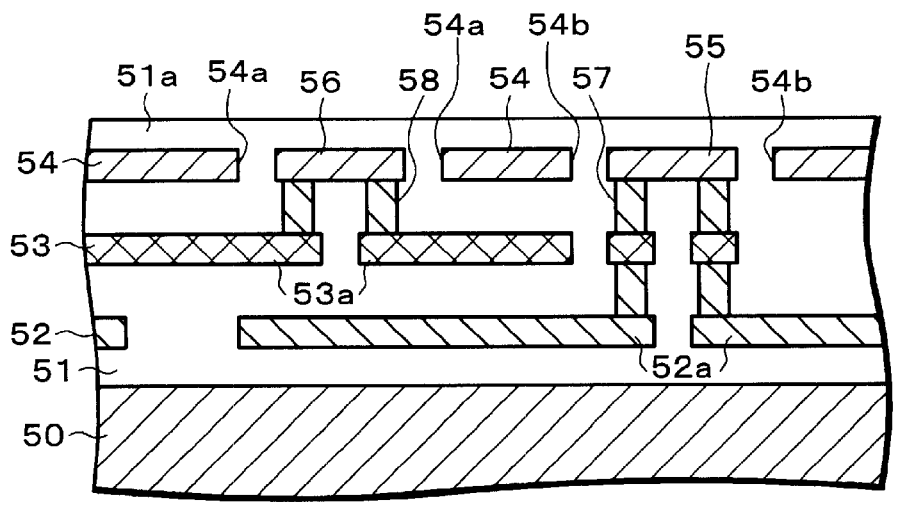
FIG. 15 is a cross-sectional view illustrating a structure of a principal part of another conventional semiconductor device.
Figure 16:
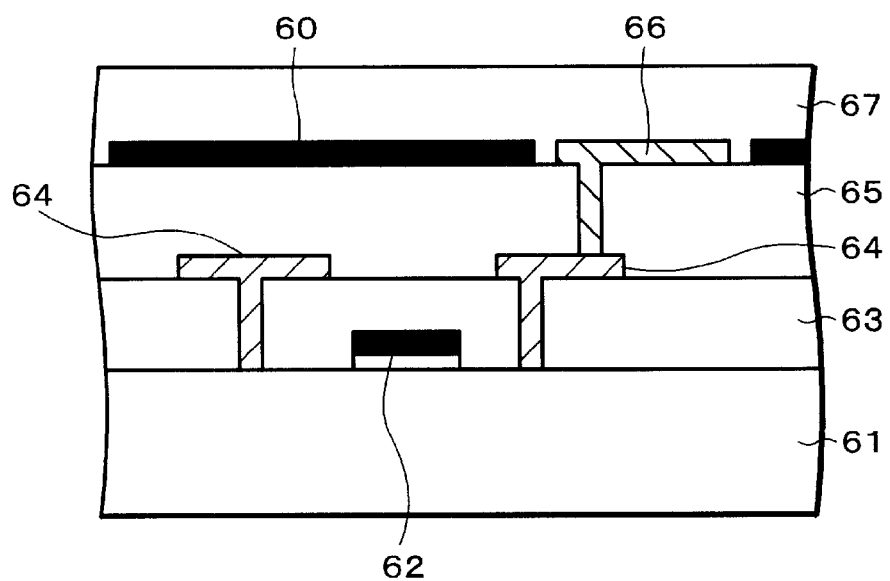
FIG. 16 is a cross-sectional view illustrating a structure of a principal part of still another conventional semiconductor device.

Incidentally, the semiconductor device in accordance with the present embodiment shown in FIG. 10 is provided with the aluminum oxide film 7 as a film having corrosion resistance, but instead of the light blocking film 5 may be rendered corrosion-resistive, as shown in FIG. 12 (cross-sectional view of a principal part of the semiconductor device). The light blocking film 5 rendered corrosion-resistive is denoted as a corrosion-resistive light-blocking film 6, on which the upper wiring 11 is provided.

The provision of the corrosion-resistive light-blocking film 6 enables to protect the circuit principal part 1a from observation. Furthermore, the use of the corrosion-resistive light-blocking film 6 made from a corrosion-resistive metal such as tantalum or niobium, instead of the light blocking film 5, makes it unnecessary to provide an aluminum oxide film 7 as shown in FIG. 10, and the corrosion-resistive light-blocking film 6 per se can be made hardly removable. Thus, the effect of providing invisibility can be enhanced.

The following description will depict a process of fabrication of a semiconductor device of the present embodiment, while referring to process flow diagrams shown in FIGS. 13(a) through 13(j).

First of all, as shown in FIG. 13(a), a conductive metal film made of aluminum or another metal is formed to a thickness of 900 nm by sputtering, for instance, on the semiconductor substrate 1 having the circuit principal part 1a, followed by resist patterning or dry etching, so that the wiring 2 is formed. On the wiring 2, a protective film 4k (first insulating protective film) is formed with silicon oxide, silicon nitride, or the like, for instance, to a thickness of 2000 nm by the P-CVD method (FIG. 13(b)). A surface of the foregoing protective film 4k is flatten by removing a raised portion thereof above the wiring 2, for instance, by a thickness of 1000 nm by the CMP method, so that surface should be flattened by eliminating unevenness (FIG. 13(c)). Next, patterning and dry etching are carried out with use of a resist 23 formed thereon, so as to form a recess in the protective film 4k above the principal circuit part 1a (FIG. 13(d)). A depth of the recess is preferably substantially equal to a thickness of the corrosion-resistive light-blocking film 6 to be formed.

Subsequently, the corrosion-resistive light-blocking film 6 is formed with tantalum or niobium throughout an entirety of the substrate by sputtering so as to have a thickness of 150 nm (FIG. 13(e)). The corrosion-resistive light-blocking film 6 is scraped off by the metal CMP method by a thickness corresponding to the thickness of the film 6 (FIG. 13(f)). By so doing, the corrosion-resistive light-blocking film 6 remains only in the recess in the protective film 4k, while being removed from the other areas.

Then, the upper wiring 11 is formed with either (i) a conductive metal film made from the same material as that for the corrosion-resistive light-blocking film 6 or another material, that is, a material inferior to an aluminum oxide film in terms of corrosion resistance, or (ii) a thin film made from a material that has a light blocking property and conductivity identical to those of a metal. For instance, a titanium nitride film is formed to a thickness of 300 nm by sputtering, and then, patterning is carried out with use of a resist 24 formed thereon (FIG. 13(g)). Further, by dry etching, the upper wiring 11 is formed on the corrosion-resistive light-blocking film 6 (FIG. 13(h)).

Finally, openings 12 are provided in a portion of the protective film 4k on the wiring 2 by patterning and etching (FIG. 13(i)), then the protective film 4l (second insulating protective film) is formed on the protective film 4k, for instance, to a thickness of 300 nm by the P-CVD method (FIG. 13(j)), so as to cover the openings 12. Thus, the structure shown in FIG. 12 is fabricated.

As described above, a semiconductor device of the present invention is a semiconductor device having a structure in which a circuit section formed on a semiconductor substrate and a main body wiring provided on the semiconductor substrate are connected with each other, and the semiconductor device includes (i) a light blocking film provided so as to cover a principal part of the circuit section, and (ii) a coating film that is laminated so as to completely cover the light blocking film and that is made from a film material having corrosion resistance.

With the foregoing arrangement wherein the light blocking film that has a light blocking property thereby exhibiting poor permeability with respect to visible light and far infrared radiation light is provided so as to cover the principal part of the circuit section, recognition of the lower circuit pattern can be made impossible. Further, since the coating film is made from a material having corrosion resistance, it is difficult to remove the coating film with use of a liquid chemical or the like. Therefore, it is possible to surely protect circuit information in the semiconductor device.

In the foregoing semiconductor device, the coating film is preferably made from aluminum oxide.

The foregoing arrangement increases the corrosion resistance effect of the coating film. This results in that a coating film made of aluminum oxide rendering a greater corrosion resistance effect is provided on the light blocking film, making it difficult to remove the light blocking film. Consequently, visibility of the lower circuit pattern can be further lowered.

Furthermore, the foregoing semiconductor device is preferably arranged so that the oxide aluminum is dyed. This renders the aluminum oxide film a light blocking property. Therefore, the visibility of the lower circuit pattern can be further lowered.

The foregoing semiconductor device is preferably arranged by further including (i) a resistance wiring that is provided in the same layer as or a layer upper than the layer where the light blocking film is provided, that is made from a conductive material inferior to the aluminum oxide in terms of corrosion resistance, and that has a resistance component, and (ii) a resistance detecting circuit that detects a change in a resistance of the resistance wiring.

With the foregoing arrangement, since aluminum oxide is a material having a great corrosion resistance effect, by making the resistance wiring from a material inferior to aluminum oxide in terms of corrosion resistance, an attempt to chemically remove the coating film causes the resistance wiring to be corroded first. This provides more sensitive detection of a change in the resistance of the resistance wiring. The circuit section may be arranged so as to, for instance, malfunction or become inoperative in response to the detection result. This makes it impossible to measure characteristics of the circuit section. Therefore, it is possible to protect the internal circuit from analysis.

Furthermore, another semiconductor device of the present invention is a semiconductor device having a structure in which a circuit section formed on a semiconductor substrate and a main body wiring provided on the semiconductor substrate are connected with each other, the semiconductor device being arranged so as to include a light blocking film that is laminated so as to cover a principal part of the circuit section and that exhibits corrosion resistance.

The foregoing arrangement in which the light blocking film has corrosion resistance makes the light blocking film unremovable. Moreover, since the light blocking film is provided so as to cover the circuit section, the visibility of the lower circuit pattern can be lowered. Besides, another corrosion-resistive film for protecting a light blocking becomes unnecessary. Therefore, a semiconductor device with invisibility can be provided in a more simplified structure.

Any one of the semiconductor devices of the foregoing two types is preferably arranged so that the insulating protective film includes (i) a first insulating protective film having an opening that is provided above the main body wiring, and (ii) a second insulating protective film that seals the opening.

In the case of this arrangement, when the second insulating protective film is chemically removed for the purpose of circuit analysis, the opening of the first insulating protective film on the main body wiring appears. Therefore, it is possible to directly damage the main body wiring due to a liquid chemical that intrudes through the opening. Therefore, it is possible to protect the internal circuit from analysis.

Any one of the foregoing semiconductor devices of the two types is preferably arranged so as to further include (i) a resistance wiring that is provided in the same layer as or a layer upper than the layer where the light blocking film is provided, and that has a resistance component, and (ii) a resistance detecting circuit that detects a change in a resistance of the resistance wiring.

With this arrangement, an attempt to physically or chemically remove the light blocking film or the upper wiring in order to observe the lower pattern causes the resistance wiring to break or the like. This results in an increase in a resistance of the resistance wiring, and this change in the resistance is detected by the resistance detecting circuit. By arranging the circuit section so as to malfunction or become inoperative in response to the detection result, measurement of characteristics of the circuit section can be made impossible. Therefore, it is possible to prevent observation of the circuit in an operating state, thereby making it difficult to analyze the inner circuit.

Furthermore, the resistance wiring is preferably arranged so as to include (i) a first wiring section connected with the detecting circuit, and (ii) a second wiring section that is made from the same material as that of the first wiring section and that covers the light blocking film. This arrangement in which the resistance wiring includes the second wiring section that functions as a light blocking film enhances the invisibility providing property of the light blocking film. Furthermore, since the first and second wiring sections are made from the same material, it is possible to form the both through the same process. Therefore, the fabrication process can be simplified.

The aforementioned another semiconductor device is arranged so that the light blocking film is made from tantalum or niobium, and this arrangement makes the light blocking film be a metal film excelling in corrosion resistance, thereby making the light blocking film difficult to be removed. Therefore, the visibility of the lower circuit pattern can be lowered.

The aforementioned semiconductor device is preferably arranged so that a surface of the insulating protective film is processed so as to be flat. In this arrangement, since the surface of the protective film covering the circuit section is flattened, there are no raised portions in the shape of the lower wiring that constitute surface steps on the protective film. Therefore, it is impossible to recognize the wiring pattern by viewing such steps. Consequently, the internal circuit can be protected from observation.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A semiconductor device comprising:
   a circuit section formed on a semiconductor substrate;
   a main body wiring that is provided on said semiconductor substrate and that is connected with said circuit section;
   a light blocking film provided so as to cover a principal part of said circuit section;
   a coating film that is laminated so as to completely cover said light blocking film and that is made from a film material having corrosion resistance;
   a resistance wiring that is provided in the same layer where said light blocking film is provided or in a layer upper than said light blocking film, and that has a resistance component; and
   a resistance detecting circuit that detects a change in a resistance of said resistance wiring.

2. The semiconductor device as set forth in claim 1, wherein said coating film is made from aluminum oxide.

3. The semiconductor device as set forth in claim 2, wherein said aluminum oxide is dyed.

4. The semiconductor device as set forth in claim 1, wherein said resistance wiring includes:
   a first wiring section connected with said resistance detecting circuit; and
   a second wiring section that is made from the same material as that of said first wiring section and that covers said light blocking film.

5. The semiconductor device as set forth in claim 4, wherein said first wiring section and said second wiring section are provided in a same layer.

6. A semiconductor device comprising:
   a circuit section formed on a semiconductor substrate;
   a main body wiring that is provided on said semiconductor substrate and that is connected with said circuit section;
   a light blocking film provided so as to cover a principal part of said circuit section;
   a coating film that is laminated so as to completely cover said light blocking film and that is made from aluminum oxide; and
   a resistance wiring that is provided in the same layer where said light blocking film is provided or in a layer upper than said light blocking film, that is made from a conductive material inferior to said aluminum oxide in terms of corrosion resistance, and that has a resistance component; and
   a resistance detecting circuit that detects a change in a resistance of said resistance wiring.

7. The semiconductor device as set forth in claim 6, wherein:

said resistance wiring includes:
- a first wiring section connected with said resistance detecting circuit; and
- a second wiring section that is made from the same material as that of said first wiring section and that covers said light blocking film.

8. The semiconductor device as set forth in claim 7, wherein said first wiring section and said second wiring section are provided in a same layer.

9. The semiconductor device as set forth in claim 6, wherein said resistance detecting circuit includes:
- a resistor whose resistance varies in response to removal of resistance wiring; and
- an inverter that compares, with a threshold value, a potential of a node connecting said resistor and said resistance wiring, and outputs a binary output signal according to the comparison result.

10. The semiconductor device as set forth in claim 6, wherein said aluminum oxide is dyed.

11. A semiconductor device comprising:
- a circuit section formed on a semiconductor substrate;
- a main body wiring that is provided on said semiconductor substrate and that is connected with said circuit section;
- a light blocking film provided so as to cover a principal part of said circuit section;
- a coating film that is laminated so as to completely cover said light blocking film and that is made from a film material having corrosion resistance; and
- an insulating protective film including a first insulating protective film having an opening that is provided above said main body wiring, and a second insulating protective film that seals said opening.

12. The semiconductor device as set forth in claim 11, wherein a surface of said insulating protective film is processed so as to be flat.

13. The semiconductor device as set forth in claim 11, wherein said coating film is made from aluminum oxide.

14. The semiconductor device as set forth in claim 13, wherein said aluminum oxide is dyed.

15. A semiconductor device comprising:
- a circuit section formed on a semiconductor substrate;
- a main body wiring that is provided on said semiconductor substrate and that is connected with said circuit section;
- a light blocking film that is laminated so as to cover a principal part of said circuit section and that exhibits corrosion resistance; and
- an insulating protective film including a first insulating protective film having an open in that is provided above said main body wiring, and a second insulating protective film that seals said opening.

16. The semiconductor device as set forth in claim 15, further comprising:
- a resistance wiring that is provided in the same layer where said light blocking film is provided or in a layer upper than said light blocking film, and that has a resistance component; and
- a resistance detecting circuit that detects a change in a resistance of said resistance wiring.

17. The semiconductor device as set forth in claim 16, wherein said resistance wiring includes:
- a first wiring section connected with said resistance detecting circuit; and
- a second wiring section that is made from the same material as that of said first wiring section and that covers said light blocking film.

18. The semiconductor device as set forth in claim 17, wherein said first wiring section and said second wiring section are provided in a same layer.

19. The semiconductor device as set forth in claim 15, wherein said light blocking film is made from tantalum or niobium.

20. The semiconductor device as set forth in claim 15, wherein a surface of said insulating protective film is processed so as to be flat.

* * * * *